(12) United States Patent
Lee

(10) Patent No.: US 11,551,763 B2
(45) Date of Patent: Jan. 10, 2023

(54) SEMICONDUCTOR MEMORY DEVICE AND METHOD OF OPERATING THE SAME

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/161,197

(22) Filed: Jan. 28, 2021

(65) Prior Publication Data

US 2022/0044733 A1 Feb. 10, 2022

(30) Foreign Application Priority Data

Aug. 10, 2020 (KR) ........................ 10-2020-0100170

(51) Int. Cl.
*G11C 16/08* (2006.01)
*G11C 16/16* (2006.01)
*G11C 16/24* (2006.01)
*G11C 16/30* (2006.01)

(52) U.S. Cl.
CPC ............... *G11C 16/16* (2013.01); *G11C 16/08* (2013.01); *G11C 16/24* (2013.01); *G11C 16/30* (2013.01)

(58) Field of Classification Search
CPC ......... G11C 16/16; G11C 16/08; G11C 16/24; G11C 16/30
USPC .................................................. 365/230.03
See application file for complete search history.

(56) References Cited

U.S. PATENT DOCUMENTS

| 6,620,682 B1 * | 9/2003 | Lee ..................... G11C 16/0416 438/257 |
| 9,514,827 B1 * | 12/2016 | Nam .................. G11C 16/0483 |
| 2010/0296344 A1 * | 11/2010 | Kim ....................... G11C 16/34 365/185.18 |
| 2013/0198440 A1 * | 8/2013 | Oh ....................... G06F 12/0246 711/103 |
| 2021/0217480 A1 * | 7/2021 | Oh .......................... G11C 16/14 |
| 2021/0249087 A1 * | 8/2021 | Oh .......................... G11C 16/16 |

FOREIGN PATENT DOCUMENTS

| CN | 103226975 A | * | 7/2013 | ......... G06F 12/0246 |
| CN | 109427397 A | * | 3/2019 | ......... G06F 12/0238 |
| KR | 10-2018-0001407 | | 1/2018 | |

\* cited by examiner

*Primary Examiner* — Ly D Pham
(74) *Attorney, Agent, or Firm* — IP & T Group LLP

(57) ABSTRACT

A semiconductor memory device includes a precharge block, a select block, a peripheral circuit, and control logic. The precharge block is connected to bit lines and includes memory cells in an erase state. The select block shares the bit lines with the precharge block and includes memory cells in a program state. The peripheral circuit performs erase operation on the select block. The control logic controls the peripheral circuit to turn on a first circuit connected to the precharge block and apply first voltage to global lines connected to the first circuit when erase voltage is applied to a source line commonly connected to the precharge block and the select block. The memory cells of the precharge block are turned on by the first voltage applied from the global lines, and the erase voltage applied to the source line is transferred to the bit lines through the precharge block.

18 Claims, 17 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0100170, filed on Aug. 10, 2020, which is incorporated herein by reference in its entirety.

BACKGROUND

Field of Invention

The present disclosure relates to an electronic device, and more particularly, to a semiconductor memory device and a method of operating the same.

DESCRIPTION OF RELATED ART

A memory device may be formed in a two-dimensional structure in which strings are horizontally arranged on a semiconductor substrate, or in a three-dimensional structure in which the strings are vertically stacked on the semiconductor substrate. A three-dimensional memory device resolves a limit of integration of a two-dimensional memory device, and may include a plurality of memory cells that are vertically stacked on a semiconductor substrate.

SUMMARY

An embodiment of the present disclosure is to provide a semiconductor memory device having an improved erase operation speed and a method of operating the same.

A semiconductor memory device according to an embodiment of the present disclosure includes a precharge block, a select block, a peripheral circuit, and control logic. The precharge block is connected to a plurality of bit lines and includes memory cells in an erase state. The select block shares the plurality of bit lines with the precharge block and includes memory cells in a program state. The peripheral circuit performs an erase operation on the select block. The control logic controls the peripheral circuit to turn on a first block select circuit connected to the precharge block and apply a first voltage to global lines connected to the first block select circuit when an erase voltage is applied to a source line commonly connected to the precharge block and the select block. The memory cells of the precharge block are turned on by the first voltage applied from the global lines, and the erase voltage applied to the source line is transferred to the plurality of bit lines through the memory cells of the precharge block.

A semiconductor memory device according to another embodiment of the present disclosure includes a memory cell array, a peripheral circuit, and control logic. The memory cell array includes a plurality of memory blocks connected to a plurality of bit lines. The peripheral circuit performs an erase operation on a select block among the plurality of memory blocks. The control logic controls the peripheral circuit to turn on a first block select circuit connected to the select block by applying a first voltage to the first block select circuit and apply a second voltage to global lines connected to the first block select circuit when an erase voltage is applied to a source line connected to the select block. Memory cells of the select block are turned on by the second voltage applied from the global lines, and the erase voltage applied to the source line is transferred to the plurality of bit lines through the memory cells of the select block.

In accordance with a method of operating a semiconductor memory device including a plurality of memory blocks according to still another embodiment of the present disclosure, a first block select circuit connected to a first memory block among the plurality of memory blocks is turned on, memory cells included in the first memory block are turned on by applying a first voltage to global lines connected to the first block select circuit, and an erase voltage is transferred to a bit line connected to the first memory block by starting an application of the erase voltage to a common source line connected to the first memory block.

A semiconductor memory device according to another embodiment of the present disclosure includes a target block, an erased block, first and second circuits, and control logic memory cell array, a peripheral circuit, and a control circuit. The target block and the erased block respectively includes first and second cell strings commonly coupled to a source line and a bit line. The first and second circuits are configured to respectively couple the target and erased blocks to global lines when turned on. The control circuit is configured to perform an erase operation on the target block by turning on the second circuit by a second voltage and providing the global lines with a third voltage to turn on the second cell string, during a set period of time, while turning on the first circuit by a first voltage lower than the second voltage, providing the source line with an erase voltage to precharge the bit line through the turned-on second cell string, and providing a fourth voltage to a select line among the global lines after the set period of time.

A semiconductor memory device according to another embodiment of the present disclosure includes a target block, a select circuit, and a control circuit. The target block includes a cell string coupled to a source line and a bit line. The select circuit is configured to couple the target block to global lines when turned on. The control circuit is configured to perform an erase operation on the target block by applying a first voltage to turn on the select circuit and applying a second voltage to the global lines to turn on the cell string, during a set period of time, the second voltage being lower than the first voltage, applying an erase voltage to the source line to precharge the bit line through the turned-on cell string, applying a third voltage, lower than the first voltage, to turn on the select circuit after the set period of time, and applying a fourth voltage to a select line among the global lines after the set period of time.

The present technology may provide a semiconductor memory device having an improved erase operation speed and a method of operating the same.

DETAILED DESCRIPTION

Specific structural and functional description is provided herein only to describe embodiments of the present disclosure. The present invention, however, may be implemented in various forms and carried out in various ways; thus, the present invention is not limited to the disclosed embodiments. Also, throughout the specification, reference to "an embodiment," "another embodiment" or the like is not necessarily to only one embodiment, and different references to any such phrase are not necessarily to the same embodiment(s). Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

Figure 1:
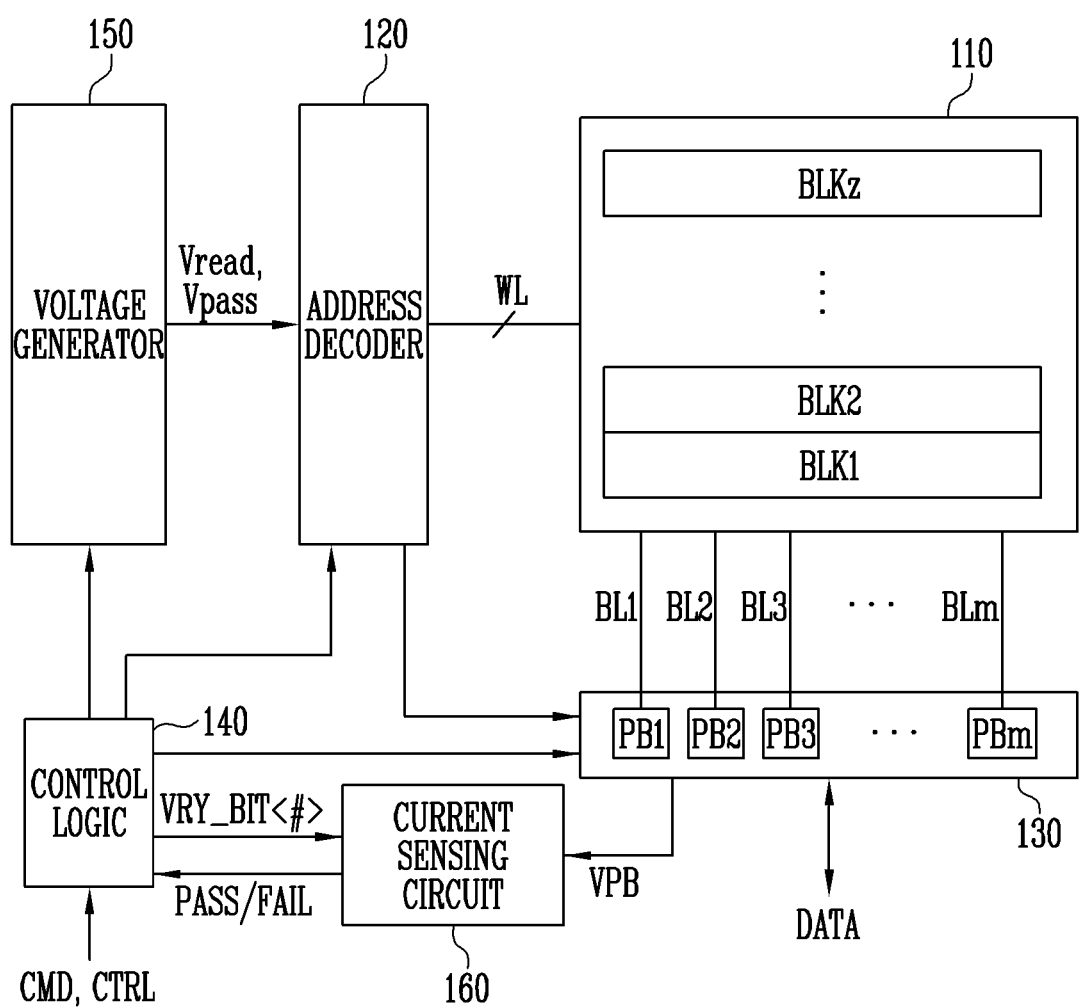
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, a voltage generator 150, and a current sensing circuit 160.

The memory cell array 110 includes a plurality of memory blocks BLK1 to BLKz, which are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, which may have a vertical channel structure. The memory cell array 110 may be configured as a two-dimensional structure. According to an embodiment, the memory cell array 110 may be configured as a three-dimensional structure. Each of the plurality of memory cells included in the memory cell array may store at least one bit of data. In an embodiment, each of the plurality of memory cells in the memory cell array 110 may be a single-level cell (SLC) storing one bit of data, a multi-level cell (MLC) storing two bits of data, a triple-level cell (TLC) storing three bits of data, or a quad-level cell (QLC) storing four bits of data. According to an embodiment, the memory cell array 110 may include a plurality of memory cells each storing five or more bits of data.

The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 may be configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as a "physical page".

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals output from the control logic 140. In the present specification, the terms write operation and program operation may be the same.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column select circuit, and the like, in addition to the page buffers (or page registers).

The control logic 140 is connected to the address decoder 120, the read and write circuit 130, the voltage generator 150, and the current sensing circuit 160. The control logic 140 receives a command CMD and a control signal CTRL through the input/output buffer (not shown) of the semiconductor memory device 100. The control logic 140 is configured to control overall operation of the semiconductor memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110.

The control logic 140 may determine whether a verification operation on a specific target program state is passed or failed in response to a pass signal PASS or a fail signal FAIL received from the current sensing circuit 160.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The current sensing circuit 160 may generate a reference current in response to a permission bit VRY_BTI<#> received from the control logic 140 during the verification operation, and may output the pass signal PASS or the fail signal FAIL by comparing a reference voltage generated by the reference current with a sensing voltage VPB received from the page buffers PB1 to PBm included in the read and write circuit 130.

More specifically, the current sensing circuit 160 may determine whether the verification operation corresponding to the specific target program state is completed, by comparing a voltage generated according to a value of a bit line sense latch included in each of the page buffers PB1 to PBm with the reference voltage generated by the reference current. The bit line sense latch included in each of the page buffers PB1 to PBm is described below with reference to FIG. 6.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
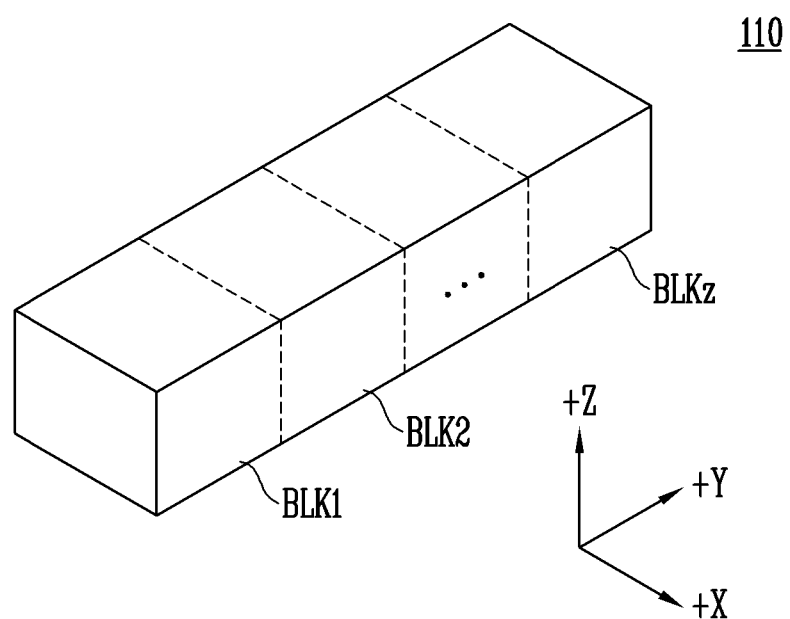
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 3 and 4.

Figure 3:
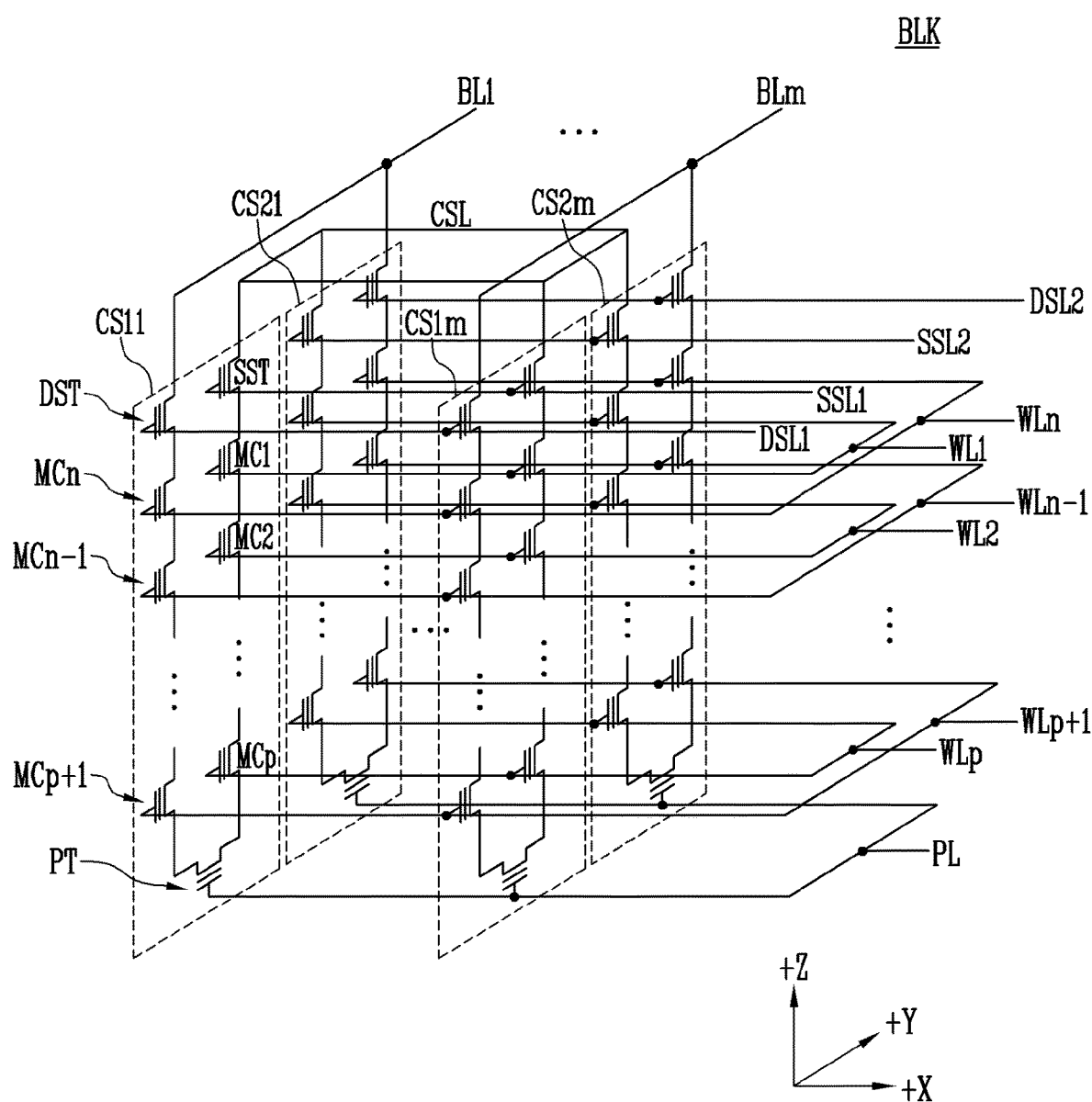
FIG. 3 is a circuit diagram illustrating any one memory block of memory blocks BLK1 to BLKz of FIG. 2.

FIG. 3 is a circuit diagram illustrating any one memory block of the memory blocks BLK1 to BLKz of FIG. 2.

Referring to FIG. 3, the memory block BLK includes a plurality of cell strings CS11 to CS1m and CS21 to CS2m. In an embodiment, each of the plurality of cell strings CS11 to CS1m and CS21 to CS2m may be formed in a 'U' shape. In the memory block BLK, m cell strings are arranged in a row direction (that is, the +X direction). In FIG. 3, two cell strings are arranged in a column direction (that is, the +Y direction). However, this is for clarity; three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a −Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistors DST of the cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp.

Alternatively, at least one dummy memory cell is provided to reduce an electric field between the drain select transistor DST and the memory cells MCp+1 to MCn. As more dummy memory cells are provided, reliability of an operation for the memory block BLK is improved, however, the size of the memory block BLK increases. As less memory cells are provided, the size of the memory block BLK may be reduced, however, the reliability of the operation for the memory block BLK may be reduced.

In order to efficiently control the dummy memory cell(s), each of the dummy memory cells may have a required threshold voltage. Before or after an erase operation for the memory block BLK, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 4:
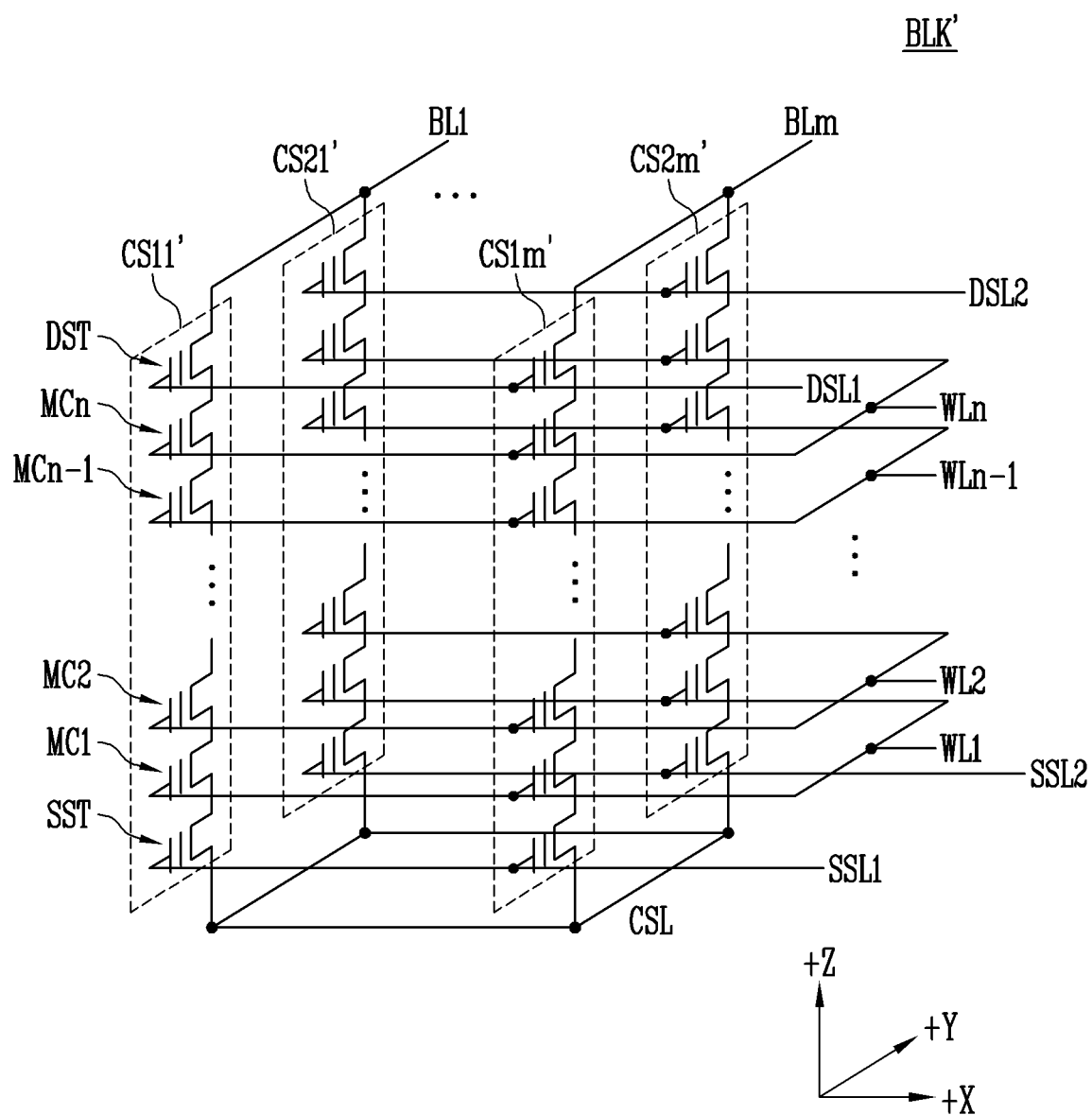
FIG. 4 is a circuit diagram illustrating another embodiment of any one memory block of the memory blocks BLK1 to BLKz of FIG. 2.

FIG. 4 is a circuit diagram illustrating another embodiment of any one memory block of the memory blocks BLK1 to BLKz of FIG. 2.

Referring to FIG. 4, the memory block BLK' includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLK' of FIG. 4 has an equivalent circuit similar to that of the memory block BLK of FIG. 3 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn.

Alternatively, at least one dummy memory cell is provided to reduce an electric field between the drain select transistor DST and the memory cells MC1 to MCn. As more dummy memory cells are provided, reliability of an operation for the memory block BLK' is improved, however, the size of the memory block BLK' increases. As less memory cells are provided, the size of the memory block BLK' may be reduced, however, the reliability of the operation for the memory block BLK' may be reduced.

In order to efficiently control the dummy memory cell(s), each of the dummy memory cells may have a required threshold voltage. Before or after an erase operation for the memory block BLK, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 5:
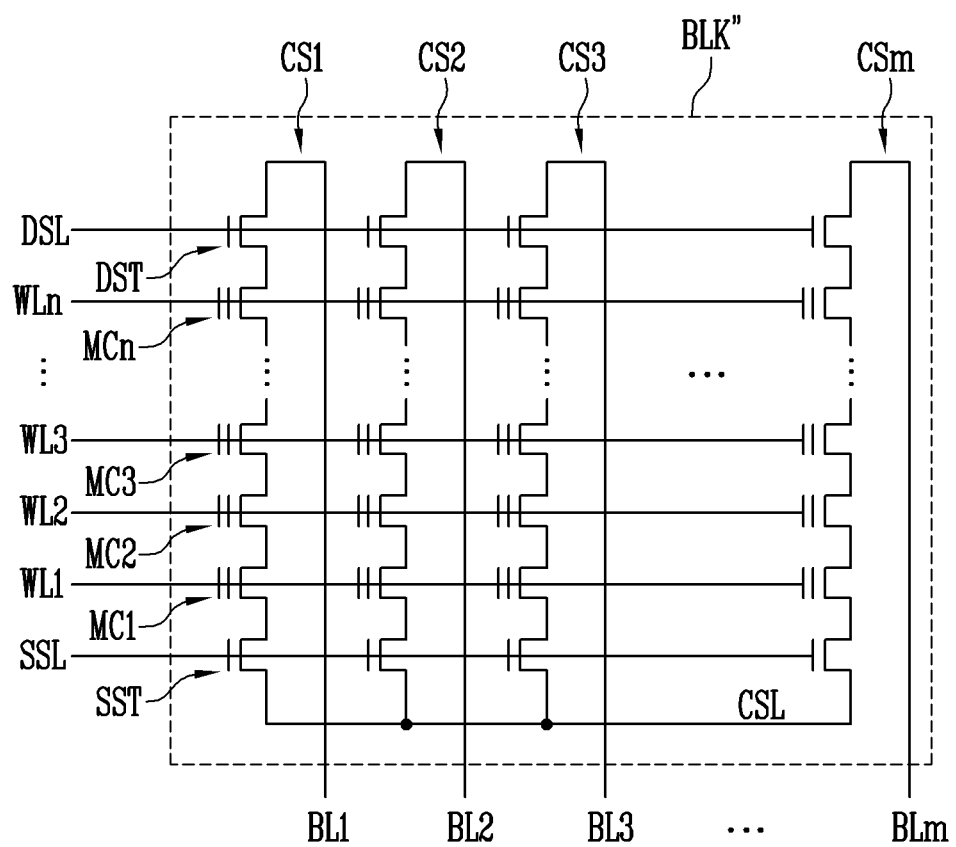
FIG. 5 is a circuit diagram illustrating an embodiment of any one memory block of the memory blocks BLK1 to BLKz included in the memory cell array of FIG. 1.

FIG. 5 is a circuit diagram illustrating an embodiment of any one memory block of the memory blocks BLK1 to BLKz included in the memory cell array 110 of FIG. 1.

Referring to FIG. 5, the memory block BKL" includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As described above, the memory cells connected to one word line may configure one physical page. In the example of FIG. 5, among the memory cells belonging to the memory block BLK', m memory cells connected to any one of the plurality of word lines WL1 to WLn configure one physical page.

As shown in FIGS. 2 to 4, the memory cell array 110 of the semiconductor memory device 100 may be configured in a three-dimensional structure. Alternatively, the memory cell array 110 may also be configured in a two-dimensional structure as shown in FIG. 5.

Figure 6:
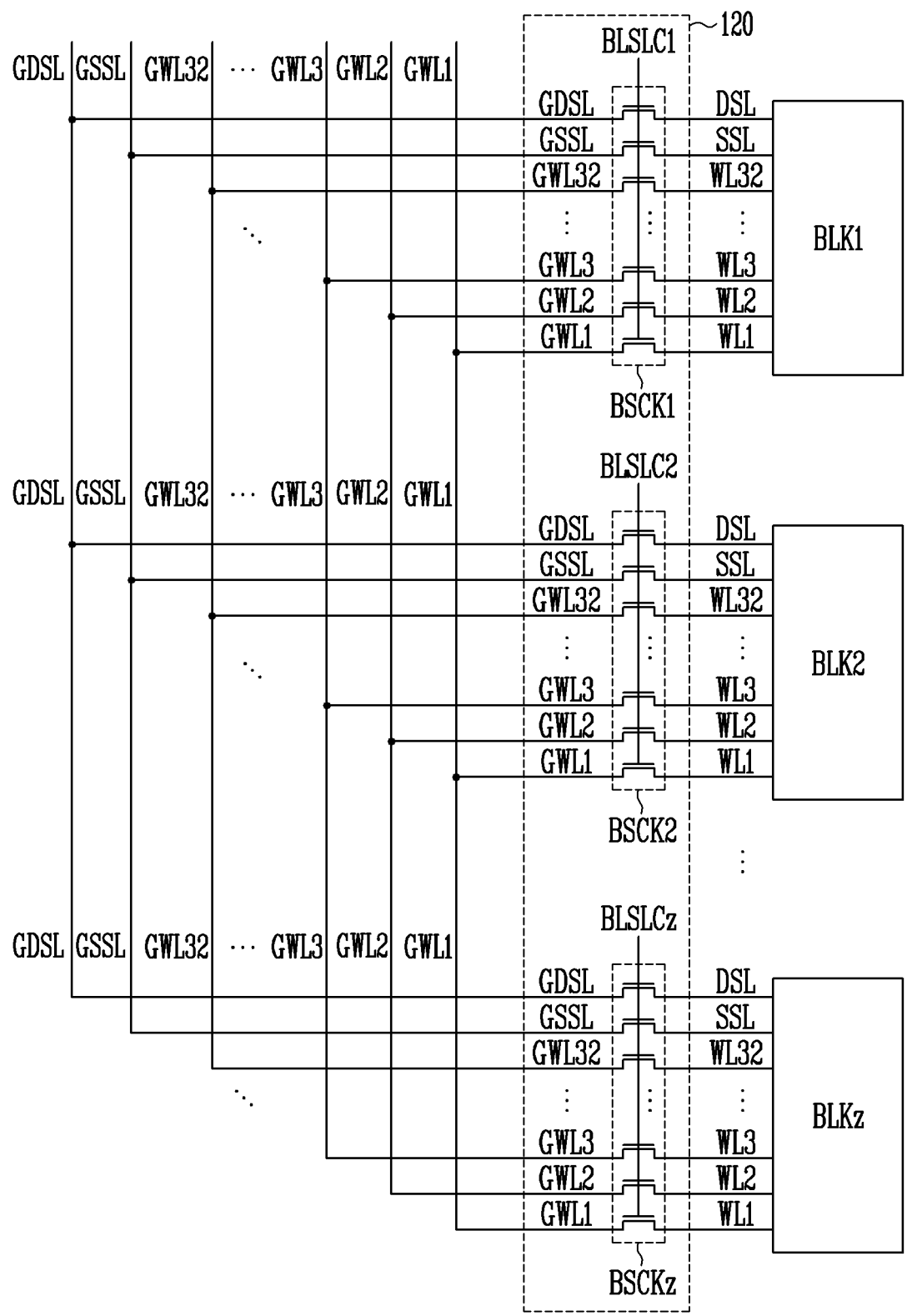
FIG. 6 is a block diagram illustrating an address decoder.

FIG. 6 is a block diagram illustrating an address decoder.

Referring to FIG. 6, global lines GL include a global drain select line GDSL, a global source select line GSSL, and global word lines GWL1 to GWL32, and voltages of various levels generated by the voltage generator 150 are transferred to the global lines GL.

The address decoder 120 includes block select circuits BSCK1 to BSCKz. The block select circuits BSCK1 to BSCKz are connected to corresponding memory blocks BLK1 to BLKz, respectively.

The address decoder 120 transfers voltages applied to the global lines to local lines DSL, SSL, and WL1 to WL32 of a selected memory block in response to block select signals BLSLC1 to BLSLCz.

Specifically, each of the block select circuits BSCK1 to BSCKz included in the address decoder 120 is configured to transfer the voltages applied to the global lines GL to the local lines DSL, SSL, and WL1 to WL32 by connecting the global lines and the local lines DSL, SSL, and WL1 to WL32 in respond to the block select signals BLSLC1 to BLSLCz.

For example, when z (z is a positive integer) memory blocks are included in the memory cell array 110, the address decoder 120 includes z block select circuits BSCK1 to BSCKz. During the erase operation, the block select circuit connected to the selected memory block to be erased may be turned on, and thus the global lines GL and the local lines DSL, SSL, and WL1 to WL32 may be connected. The block select circuit connected to the unselect memory block that is not to be erased may be turned off.

Figure 7:
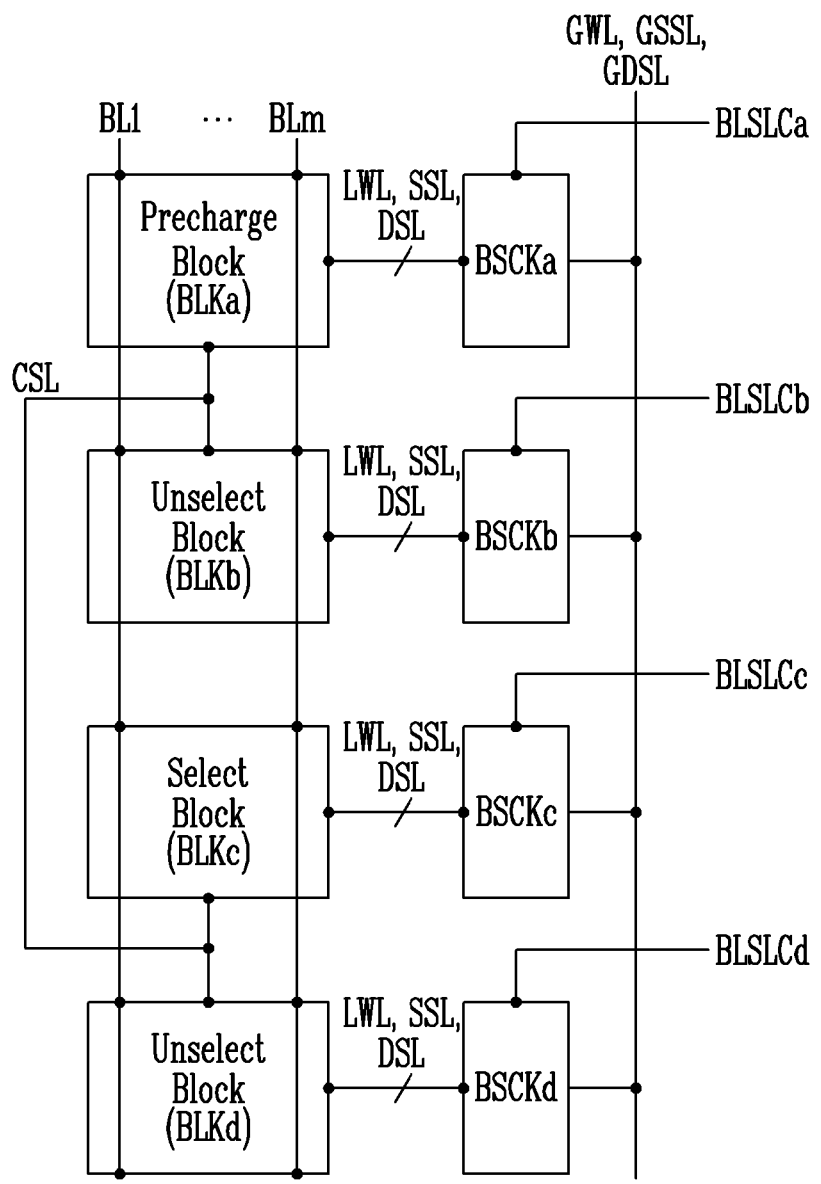
FIG. 7 is a diagram illustrating an erase operation of a semiconductor memory device according to an embodiment of the present disclosure.

FIG. 7 is a diagram illustrating the erase operation of the semiconductor memory device according to an embodiment of the present disclosure.

Referring to FIG. 7, a-th to d-th memory blocks BLKa to BLKd are commonly connected to the first to m-th bit lines BL1 to BLm. The a-th to d-th memory blocks BLKa to BLKd may be included in the memory cell array 110. The memory cell array 110 may include more than the four memory blocks shown in FIG. 7; the four a-th to d-th memory blocks BLKa to BLKd are shown in FIG. 7 as an example. Gate electrodes of memory cells included in the a-th to d-th memory blocks BLKa to BLKd may be respectively connected to local word lines, and the local word lines may be connected to the global word lines through corresponding block select circuits BSCKa to BSCKd.

Local word lines LWL of the a-th memory block BLKa may be connected to a global word line GWL through the block select circuit BSCKa. Local word lines LWL of the b-th memory block BLKb may be connected to the global word line GWL through the block select circuit BSCKb. Local word lines LWL of the c-th memory block BLKc may be connected to the global word line GWL through the block select circuit BSCKc. Local word lines LWL of the d-th memory block BLKd may be connected to the global word line GWL through the block select circuit BSCKd.

The local select lines SSL and DSL of the a-th memory block BLKa may be connected to the global select lines GSSL and GDSL through the block select circuit BSCKa. The local select lines SSL and DSL of the b-th memory block BLKb may be connected to the global select lines GSSL and GDSL through the block select circuit BSCKb. The local select lines SSL and DSL of the c-th memory block BLKc may be connected to the global select lines GSSL and GDSL through the block select circuit BSCKc. The local select lines SSL and DSL of the d-th memory block BLKd may be connected to the global select lines GSSL and GDSL through the block select circuit BSCKd.

The a-th to d-th block select circuits BSCKa to BSCKd respectively corresponding to the a-th to d-th memory blocks BLKa to BLKd may be connected to a-th to d-th block select signals BLSLCa to BLSLCd, respectively. The common source line CSL may be commonly connected to the a-th to d-th memory blocks BLKa to BLKd.

In the embodiment of FIG. 7, it is assumed that the c-th memory block BLKc is selected to be erased among the a-th to d-th memory blocks BLKa to BLKd.

Thus, the c-th memory block BLKc is a selected block, and the b-th and d-th memory blocks BLKb and BLKd are unselected blocks. In addition, the a-th memory block BLKa used to precharge a bit line among the unselected blocks is a precharge block. According to an embodiment of the present disclosure, the precharge block may be in an erase state. That is, during the erase operation of the select memory block BLKc, any one of the memory blocks BLKa, BLKb and BLKd in the erase state may be the precharge block.

Figure 8:
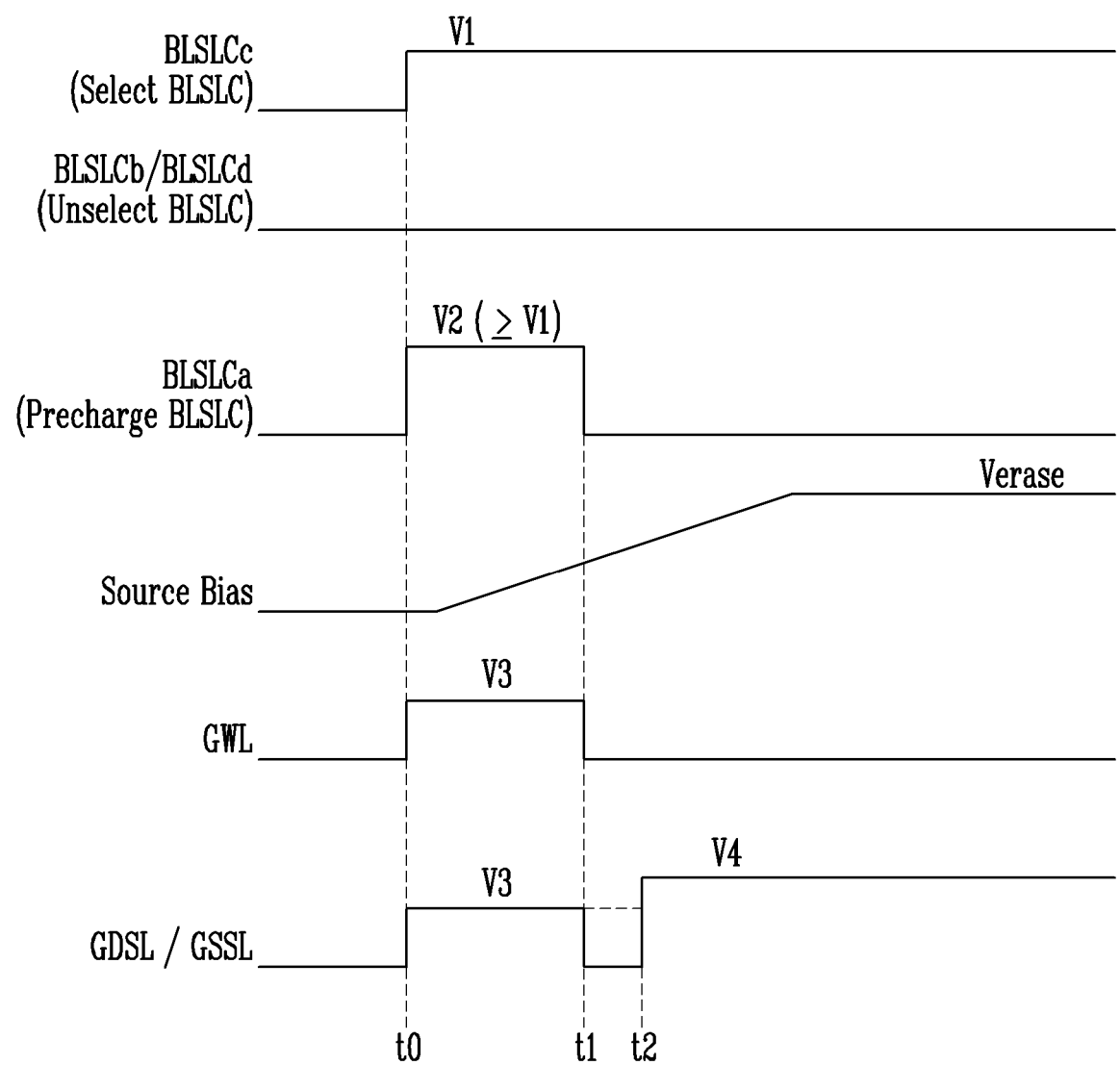
FIG. 8 is a timing diagram illustrating a method of erasing data in a semiconductor memory device according to an embodiment of the present disclosure.

FIG. 8 is a timing diagram illustrating a method of erasing data in a semiconductor memory device according to an embodiment of the present disclosure.

Referring to FIG. 8, at time t0, the c-th block select signal BLSLCc applied to the c-th block select circuit BSCKc connected to the c-th memory block BLKc, which is the selected block, is activated from 0V to a V1 level. The V1 level may be a voltage level for turning on transistors included in the c-th block select circuit BSCKc. In an embodiment, the V1 level may be a voltage level higher by a set value than a voltage for turning on the transistors included in the c-th block select circuit BSCKc.

As the c-th block select signal BLSLCc is activated to the V1 level, the global word line GWL is connected to the local word lines LWL of the c-th memory block BLKc, and the global select lines GDSL and GSSL are connected to the local select lines DSL and SSL of the c-th memory block BLKc.

The b-th and d-th block select signals BLSLCb and BLSLCd applied to the b-th and d-th block select circuits BSCKb and BSCKd respectively connected to the b-th and d-th memory blocks BLKb and BLKd, which are the unselected blocks, may be a relatively low voltage. For example, the b-th and d-th block select signals BLSLCb and BLSLCd may be 0V. Therefore, transistors included in the b-th and d-th block select circuits BSCKb and BSCKd may be in a turn-off state. Accordingly, the local word line LWL and the select lines DSL and SSL connected to the b-th and d-th memory blocks BLKb and BLKd may be in a floating state.

At time t0, the a-th block select signal BLSLCa applied to the a-th block select circuit BSCKa connected to the a-th memory block BLKa, which is the precharge block, is activated from 0V to a V2 level. The V2 level may turn on transistors included in the a-th block select circuit BSCKa. In an embodiment, the V2 level may be a signal equal to or greater than the V1 level. Therefore, the transistors included in the a-th block select circuit BSCKa may be turned on more strongly than the transistors included in the c-th block select circuit BSCKc.

At time t0 or immediately thereafter, a source bias applied to the common source line CSL may start to increase to an erase voltage Verase.

At time t0, a voltage of a V3 level is applied to the global word line GWL and the global select lines GDSL and GSSL. As described above, since the a-th block select signal BLSLCa is activated from 0V to the V2 level at time t0, the transistors included in the a-th block select circuit BSCKa are strongly turned on. Accordingly, the voltage V3 applied to the global word line GWL and the global select lines GDSL and GSSL is transferred to the local word line LWL and the local select lines DSL and SSL connected to the a-th block select circuit BSCKa. As described above, since the precharge block is the memory block in the erase state, all of the select transistors and memory cells included in the precharge block are turned on. Accordingly, the voltage applied to the common source line as the source bias is transferred to the first to m-th bit lines BL1 to BLm through the precharge block.

That is, at the beginning of the erase operation on the selected block BLKc, when the memory cells and select transistors in the precharge block BLKa in the erase state are turned on for a short time (short turn-on), the erase voltage Verase is smoothly transferred from the common source line CSL to the first to m-th bit lines BL1 to BLm through the cell strings in the precharge block BLKa. Accordingly, the first to m-th bit lines BL1 to BLm commonly connected to the memory blocks are precharged. As a result, the erase operation may quickly proceed. Improving the erase operation speed by precharging the bit line is described below.

Since the c-th block select signal BLSLCc is activated from 0V to the V1 level at time t0, transistors included in the c-th block select circuit BSCKc are turned on. Accordingly, the voltage applied to the global word line GWL and the global select lines GDSL and GSSL are applied to the local word line LWL and the local select lines DSL and SSL connected to the c-th block select circuit BSCKc. Since memory cells included in the c-th memory block, which is the selected block, include a plurality of program cells, the source bias of the common source line CSL may not be transferred to the first to m-th bit lines BL1 to BLm through the selected block BLKc even though a voltage of the V3 level is transferred to the selected block BLKc through the local word line LWL.

At a time point t1, the a-th block select signal BLSLCa applied to the a-th block select circuit BSCKa connected to the a-th memory block BLKa, which is the precharge block, is deactivated from the V2 level to 0V. Therefore, the transistors included in the a-th block select circuit BSCKa may be turned off, and the local word line LWL and the select lines DSL and SSL connected to the a-th memory block BLKa may remain in a floating state.

A voltage of the global word line GWL and the global select lines GDSL and GSSL may decrease at time t1. For example, the voltage of the global word line GWL and the global select lines GDSL and GSSL may decrease to 0V at time t1. In another embodiment, as indicated by a dotted line of FIG. 8, the voltage of the global select lines GDSL and GSSL may remain at the V3 level between time t1 and time t2.

Thereafter, at time t2, the voltage of the global select lines GDSL and GSSL increases to a V4 level, and the memory cells of the selected block starts to be erased. After time t2, the ground voltage may be applied to the local word lines of the selected block. Thereafter, a potential level of a channel increases according to a potential level of the common source line CSL, and data stored in the memory cells is erased by the increased potential level of the channel. That is, electrons stored in a charge storage layer of the memory cells by an FN tunneling phenomenon are de-trapped by a potential of the channel. More specifically, the electrons stored in the charge storage layer of the memory cells move to the channel and are de-trapped according to a difference in the increased potential level of the channel and the potential level of the local word lines having the ground level, or a hot hole generated in the channel flows into the charge storage layer of the memory cells and the electrons stored in the charge storage layer are de-trapped.

After the data of the memory cells is erased by the erase operation, the erase voltage Verase applied to the common source line CSL is blocked, and a potential of the common source line CSL is discharged.

In the erase operation, when the relatively high erase voltage Verase is applied to the common source line CSL, a gate induce current (gate induce drain leakage (GIDL)) may occur in the source select transistor, a hot hole may be generated and may flow in a direction of the channel, and the potential of the channel may increase.

According to the existing erase method, at this time, a voltage of the bit line may be formed to be lower than the erase voltage of the common source line CSL. Therefore, due to a potential difference between the common source line CSL and the bit lines, the potential of the channel and the hole may flow in a direction of the bit line, and thus an erase characteristic may be deteriorated.

According to an embodiment of the present disclosure, at the beginning of the erase operation on the selected block, when the memory cells and the select transistors in the precharge block, which is in the erase state, are turned on for a short time (short turn-on), the erase voltage Verase is smoothly transferred from the common source line to the first to m-th bit lines BL1 to BLm through the cell strings in the precharge block. Accordingly, the first to m-th bit lines BL1 to BLm commonly connected to the memory blocks are precharged. As a result, the erase operation may quickly proceed.

Figure 9:
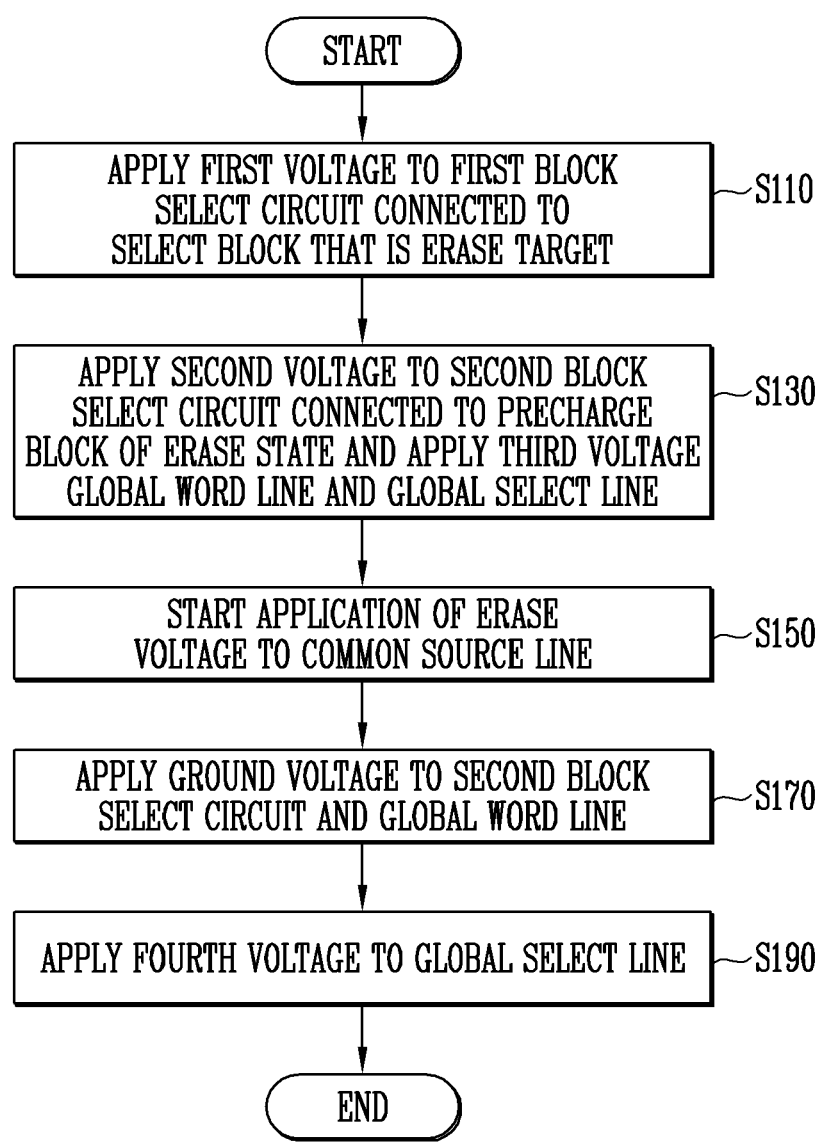
FIG. 9 is a flowchart illustrating a method of erasing data in a semiconductor memory device according to an embodiment of the present disclosure.
Figure 10:
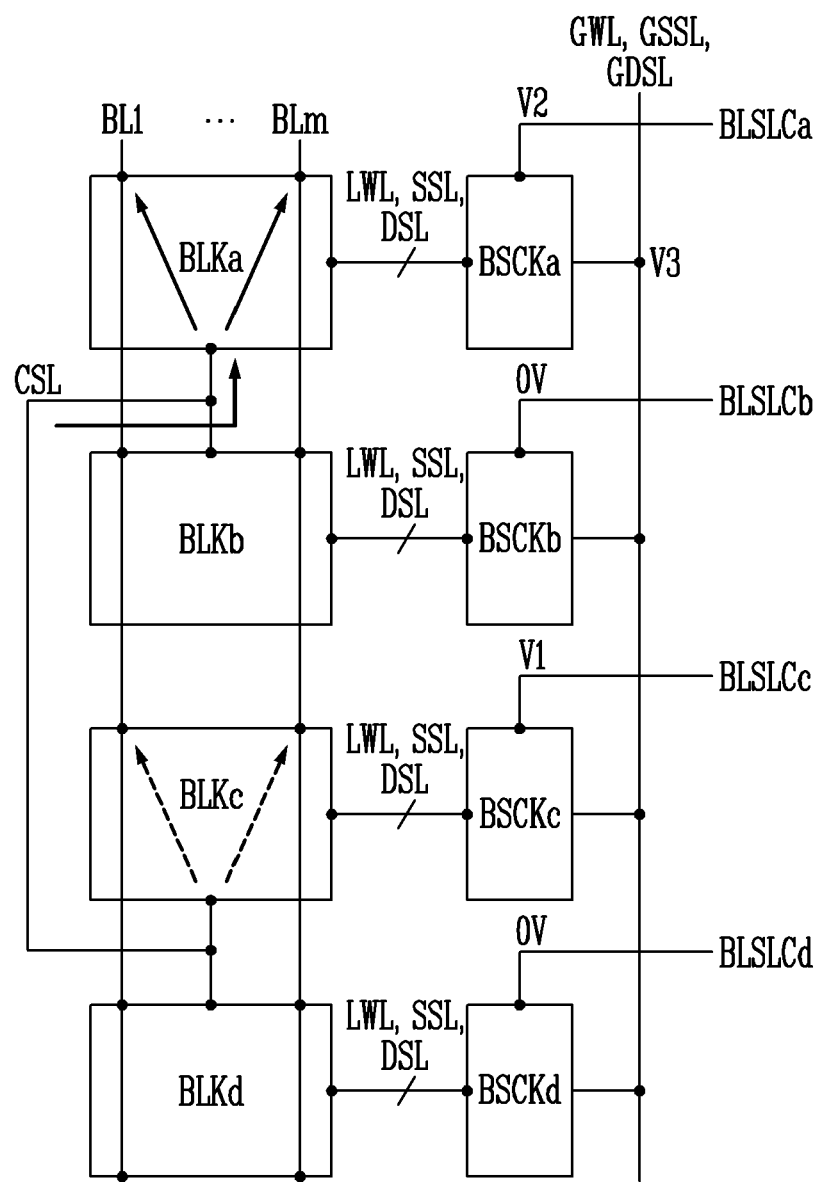
FIG. 10 is a diagram illustrating a bit line precharge through a precharge block in a method of erasing data in a semiconductor memory device according to an embodiment of the present disclosure.

FIG. 9 is a flowchart illustrating a method of erasing data in the semiconductor memory device according to an embodiment of the present disclosure. FIG. 10 is a diagram illustrating a bit line precharge through the precharge block in a method of erasing data in the semiconductor memory device according to an embodiment of the present disclosure. Such method is described below with reference to FIGS. 8 to 10 together.

Referring to FIG. 9, in a method of erasing data in the semiconductor memory device according to an embodiment of the present disclosure, first, a first voltage is applied to a first block select circuit connected to a selected block that is an erase target (S110). In the example shown in FIGS. 7 and 8, the selected block may be the c-th memory block BLKc. The first block select circuit may be the c-th block select circuit BSCKc shown in FIG. 7. In operation S110, the c-th block select signal BLSLCc may be applied through the block word line connected to the c-th block select circuit BSCKc. That is, the c-th block select signal BLSLCc may be applied to gates of the transistors in the c-th block select circuit BSCKc. As shown in FIG. 8, at time t0, the c-th block select signal BLSLCc increases to the V1 level. The first voltage of operation S110 may correspond to the V1 level shown in FIG. 8. By operation S110, the transistors included in the c-th block select circuit BSCKc connected to the c-th memory block BLKc, which is the selected block, are turned on.

Then, a second voltage is applied to a second block select circuit connected to the precharge block in the erase state, and a third voltage is applied to the global word line and the global select line (S130). The precharge block in the erase state may corresponds to the a-th memory block BLKa of FIGS. 7 and 8. The second block select circuit may be the a-th block select circuit BSCKa shown in FIG. 7. In operation S130, the a-th block select signal BLSLCa may be applied through the block word line connected to the a-th block select circuit BSCKa. The second and third voltages of operation S130 may correspond to the V2 level and the V3 level of FIG. 8, respectively. Activating the a-th block select signal BLSLCa to the V2 level and activating the voltage of the global word line GWL and the global select lines GDSL and GSSL to the V3 level at time t0 of FIG. 8 may correspond to operation S130 of FIG. 9. Therefore, by operation S130, the transistors in the a-th block select circuit BSCKa connected to the a-th memory block BLKa that is the precharge block are turned on. That is, the second block select circuit connected to the precharge block is turned on.

Thereafter, application of the erase voltage to the common source line is started (S150). Accordingly, the source bias applied to the common source line CSL increases. As described above, since the memory cells and the select transistors included in the precharge block, that is, the a-th memory block BLKa are turned on at time t0, the source bias may be transferred to the first to m-th bit lines BL1 to BLm. Accordingly, the first to m-th bit lines BL1 to BLm are precharged.

Thereafter, the ground voltage is applied to the second block select circuit and the global word line (S170). Referring to FIG. 8, at time t1, the a-th block select signal BLSLCa applied to the a-th block select circuit BSCKa connected to the a-th memory block BLKa, which is the precharge block, decreases to 0V. Accordingly, the local word lines and the select lines connected to the precharge block may be floated.

Thereafter, a fourth voltage is applied to the global select line (S190). Referring to FIG. 8, the voltage of the global select lines GDSL and GSSL increases to the V4 level at time t2. As the source bias increases to the erase voltage Verase, the gate induce current (gate induce drain leakage (GIDL)) may occur in the source select transistor and the drain select transistor of the c-th memory block BLKc, which is the selected block, and the hot hole may flow into the direction of the channel. Accordingly, while the potential of the channel increases, the voltage of the local word line of the c-th memory block BLKc (i.e., the selected block) is maintained at 0V, and thus the memory cells included in the c-th memory block BLKc are erased.

In addition, it is shown that operations S170 and S190 are sequentially performed in the method of operating the semiconductor memory device according to an embodiment. However, the present invention is not limited to that timing. In another embodiment, operations S170 and S190 may be performed in the reverse order. In still another embodiment, some operations of S170 and S190 may be simultaneously performed, while others are performed in any suitable order consistent with the teachings herein.

Referring to FIG. 10, a voltage application condition and a bit line precharge operation according thereto between time t0 and time t1 are shown. As described above, between time t0 and time t1, the c-th block select signal BLSLCc is activated to the V1 level, and the a-th block select signal BLSLCa is activated to the V2 level. Accordingly, the local word lines LWL connected to the c-th memory block BLKc (i.e., the selected block) and the a-th memory block BLKa (i.e., the precharge block) are connected to the global word line, and the select lines DSL and SSL connected to the c-th memory block BLKc and the first memory block BLKa are connected to the global select lines GDSL and GSSL, respectively.

In a case of the c-th memory block BLKc, which is the selected block, since program cells exist, a plurality of memory cells included in the c-th memory block BLKc are turned off. Accordingly, the source bias applied to the common source line CSL is not transferred to the first to m-th bit lines BL1 to BLm through the c-th memory block BLKc.

On the other hand, in a case of the a-th memory block BLKa, which is the precharge block, since the a-th memory block BLKa is in the erased state, all memory cells included in the a-th memory block BLKa are turned on. Accordingly, the source bias applied to the common source line CSL is quickly transferred to the first to m-th bit lines BL1 to BLm through the a-th memory block BLKa. Thus, the first to m-th bit lines BL1 to BLm are precharged.

Figure 11:
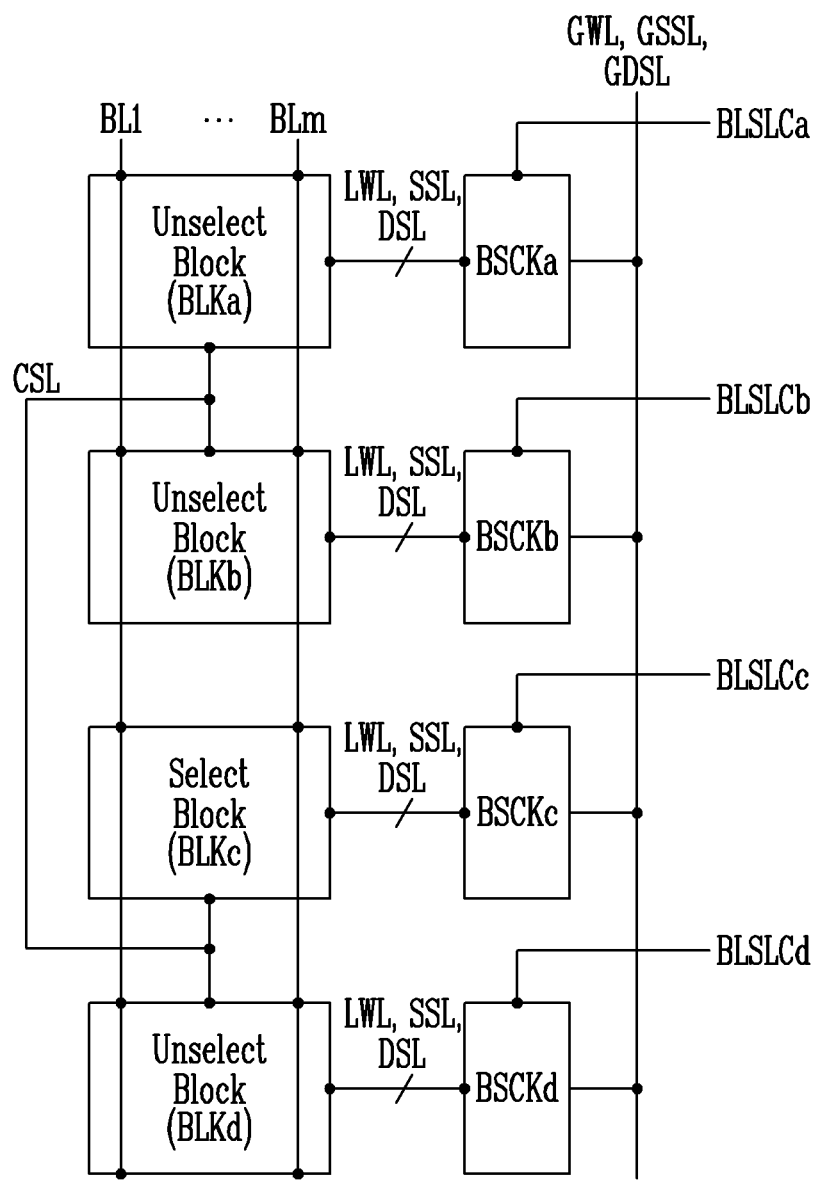
FIG. 11 is a diagram illustrating an erase operation of a semiconductor memory device according to another embodiment of the present disclosure.

FIG. 11 is a diagram illustrating an erase operation of a semiconductor memory device according to another embodiment of the present disclosure. Comparing embodiments of FIGS. 7 and 11, in a case of the embodiment shown in FIG. 7, the a-th memory block BLKa is the precharge block, whereas in a case of the embodiment shown in FIG. 11, there is no precharge block. That is, in FIG. 11, the c-th memory block BLKc is the select blocked, and the a-th, b-th, and d-th memory blocks BLKa, BLKb, and BLKd are unselected blocks.

In the embodiment according to FIG. 11, the first to m-th bit lines BL1 to BLm are precharged through the selected block without using a precharge block. A detailed method of precharging the first to m-th bit lines BL1 to BLm through the selected block is described below with reference to FIGS. 12 to 14.

Figure 12:
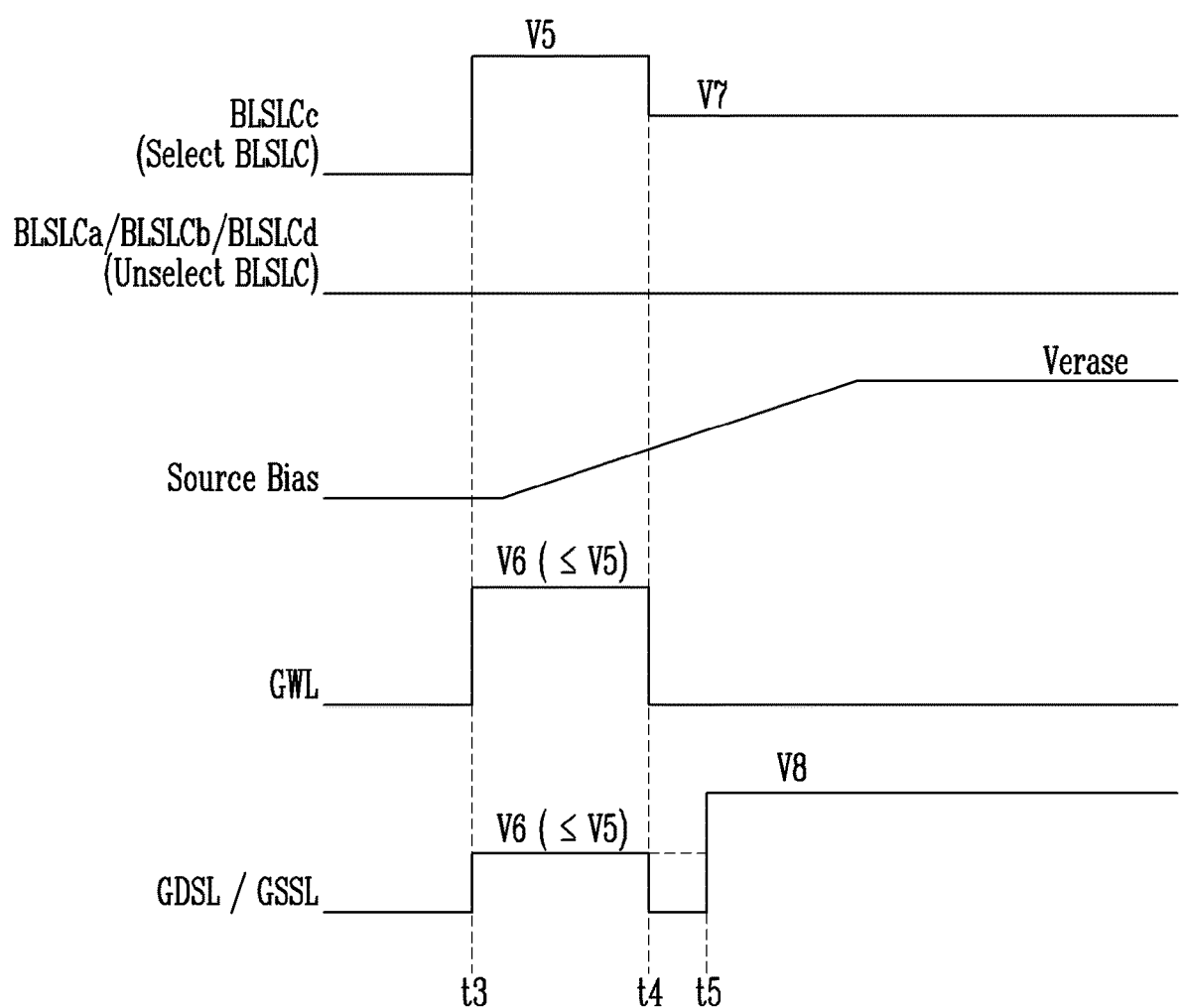
FIG. 12 is a timing diagram illustrating a method of erasing data in a semiconductor memory device according to another embodiment of the present disclosure.

FIG. 12 is a timing diagram illustrating a method of erasing a semiconductor memory device according to another embodiment of the present disclosure.

Referring to FIG. 12, at time t3, the c-th block select signal BLSLCc applied to the c-th block select circuit BSCKc connected to the c-th memory block BLKc, which is the selected block, is activated from 0V to a V5 level. The V5 level may be greater than the V1 level shown in FIG. 8. For example, the V5 level may be higher by a set value than the voltage for turning on the transistors included in the c-th block select circuit BSCKc. In an embodiment, the V5 level may be substantially the same as the V2 level shown in FIG. 8.

As the c-th block select signal BLSLCc is activated to the V5 level, the global word line GWL is connected to the local word lines LWL of the c-th memory block BLKc, and the global select lines GDSL and GSSL are connected to the local select lines DSL and SSL of the c-th memory block BLKc.

The block select signals BLSLCa, BLSLCb, and BLSLCd applied to block circuits BSCKa, BSCKb, and BLKd respectively connected to the memory blocks BLKa, BLKb, and BLKd, which are the unselected blocks, may be 0V. Therefore, the local word lines LWL and the select lines DSL and SSL connected to the memory blocks BLKa, BLKb, and BLKd may maintain a floating state.

At time t3 or immediately thereafter, a source bias applied to the common source line CSL may start to increase to an erase voltage Verase.

At time t3, a voltage of a V6 level is applied to the global word line GWL and the global select lines GDSL and GSSL. In an embodiment, the V6 level may be equal to or less than the V5 level. As described above, since the c-th block select signal BLSLCc is activated from 0V to the V5 level at time t3, the transistors included in the c-th block select circuit BSCKc are turned on. Accordingly, the voltage V6 applied to the global word line GWL and the global select lines GDSL and GSSL is transferred to the local word line LWL and the local select lines DSL and SSL connected to the c-th block select circuit BSCKc.

A voltage of the V6 level transferred to the global word line GWL may be capable of turning on all memory cells included in the selected block BLKc. That is, among the memory cells included in BLKc, a voltage higher than a threshold voltage of the memory cells in the program state may be the V6 level. Therefore, differently from the embodiment of FIG. 8, in the embodiment of FIG. 12, all memory cells in the selected block BLKc are turned on. Accordingly, the voltage applied to the common source line CSL as the source bias is transferred to the first to m-th bit lines BL1 to BLm through the selected block BLKc.

That is, at the beginning of the erase operation on the selected block BLKc, when the memory cells and select transistors in BLKc are turned on for a short time (short turn-on), the erase voltage Verase is smoothly transferred from the common source line CSL to the first to m-th bit lines BL1 to BLm through the cell strings in BLKc. Accordingly, the first to m-th bit lines BL1 to BLm commonly connected to the memory blocks are precharged. As a result, the erase operation may quickly proceed.

At a time point t4, the c-th block select signal BLSLCc applied to the c-th block select circuit BSCKc connected to the c-th memory block BLKc, which is the selected block, decreases from the V5 level to a V7 level. The V7 level may turn on the transistors included in the c-th block select circuit BSCKc. At time t4, the voltage of the global word line GWL and the global select lines GDSL and GSSL may decrease. For example, at time t4, the voltage of the global word line GWL and the global select lines GDSL and GSSL may decrease to 0V. In another embodiment, as indicated by a dotted line of FIG. 12, the voltage of the global select lines GDSL and GSSL may maintain the V6 level between time t4 and time t5.

Thereafter, at time t5, the voltage of the global select lines GDSL and GSSL increases to a V8 level, and the memory cells of the selected block starts to be erased. The V8 level may be substantially the same as the V4 level of FIG. 8. After time t5, the ground voltage may be applied to the local word lines of the selected block. Thereafter, the potential level of the channel increases according to the potential level of the common source line CSL, and the data stored in the memory cells is erased by the increased potential level of the channel. That is, the electrons stored in the charge storage layer of the memory cells by an FN tunneling phenomenon are de-trapped by the potential of the channel. More specifically, the electrons stored in the charge storage layer of the memory cells move to the channel and are de-trapped according to the difference in the increased potential level of the channel and the potential level of the local word lines having the ground level, or the hot hole generated in the channel flows into the charge storage layer of the memory cells and the electrons stored in the charge storage layer are de-trapped.

According to another embodiment of the present disclosure, at the beginning of the erase operation on the selected block, when the memory cells and the select transistors in the selected block are turned on for a short time (short turn-on), the erase voltage Verase is smoothly transferred from the common source line to the first to m-th bit lines BL1 to BLm through the cell strings in the selected block. Accordingly, the first to m-th bit lines BL1 to BLm commonly connected to the memory blocks are precharged. As a result, the erase operation may quickly proceed.

Figure 13:
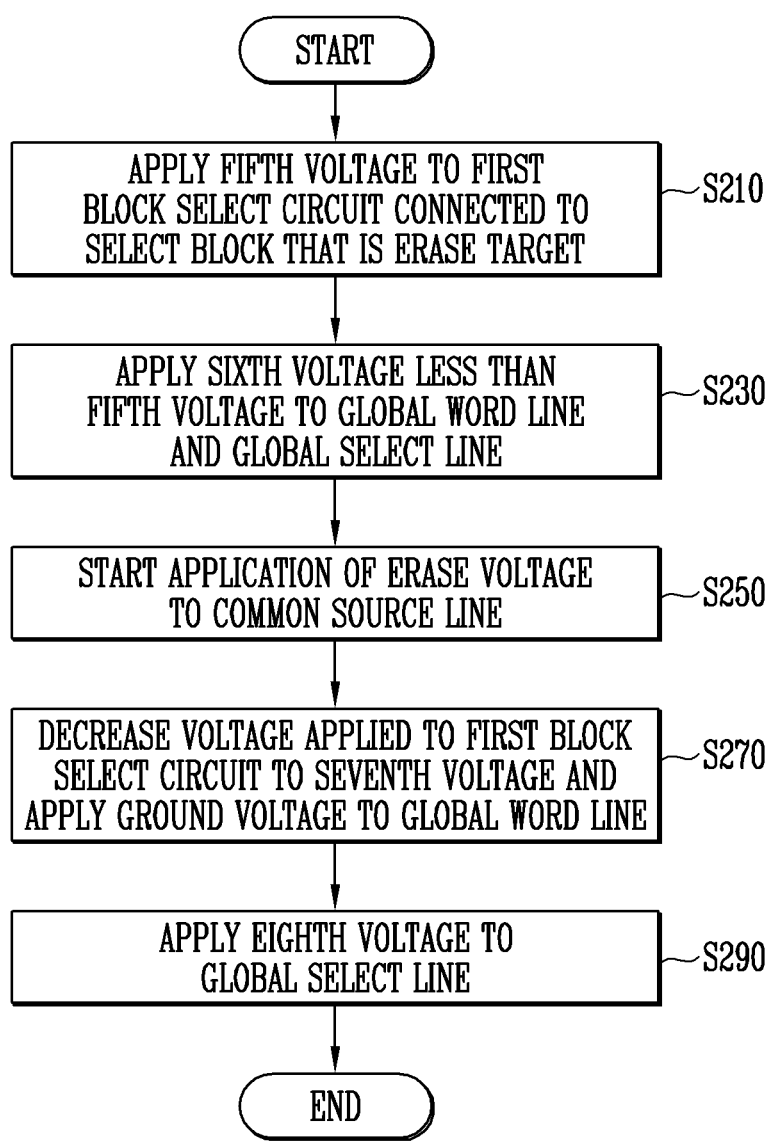
FIG. 13 is a flowchart illustrating a method of erasing data in a semiconductor memory device according to an embodiment of the present disclosure.
Figure 14:
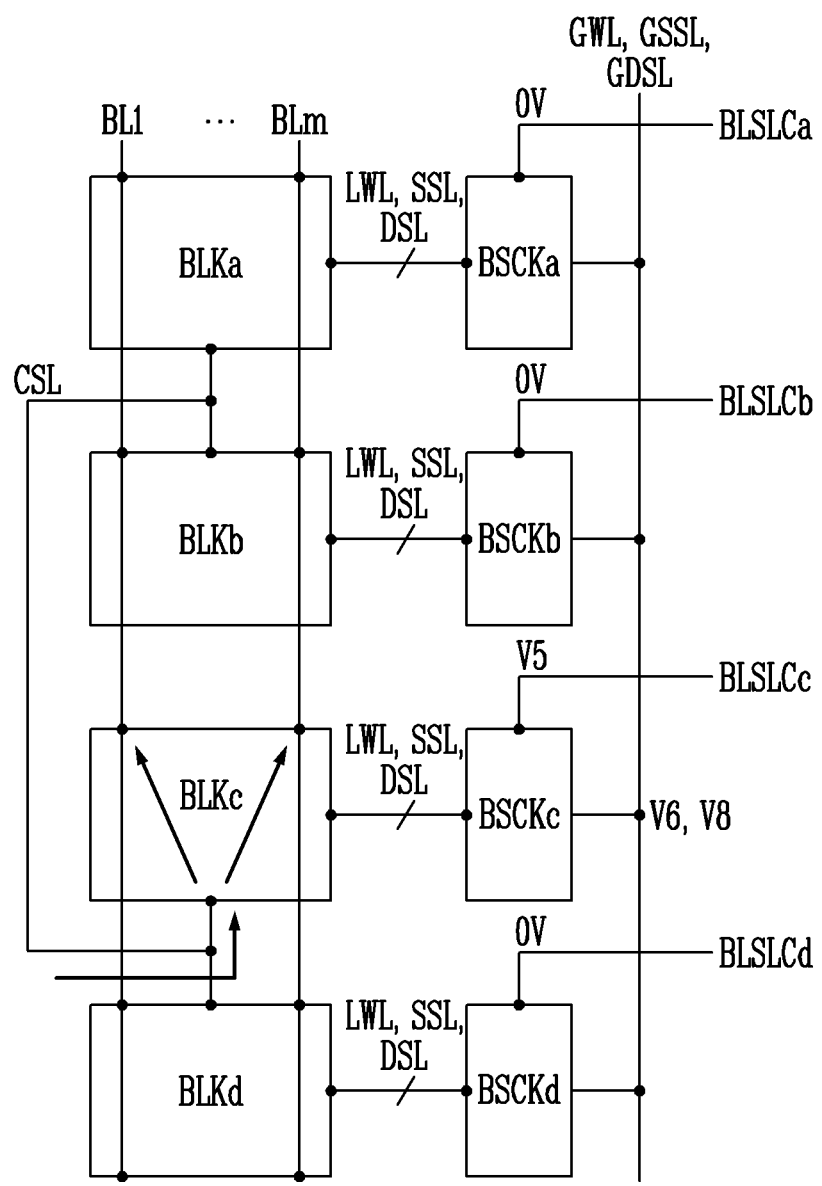
FIG. 14 is a diagram illustrating a bit line precharge through a precharge block in the method of erasing data in a semiconductor memory device according to an embodiment of the present disclosure.

FIG. 13 is a flowchart illustrating a method of erasing the semiconductor memory device according to an embodiment of the present disclosure. FIG. 14 is a diagram illustrating a bit line precharge through the precharge block in the method of erasing data in the semiconductor memory device according to an embodiment of the present disclosure. Such method is described below with reference to FIGS. 12 to 14 together.

Referring to FIG. 12, in the method of erasing data in the semiconductor memory device according to an embodiment of the present disclosure, first, a fifth voltage is applied to a first block select circuit connected to a selected block that is an erase target (S210). In the example shown in FIGS. 11 and 12, the selected block may be the c-th memory block BLKc shown in FIG. 11. The first block select circuit may be the c-th block select circuit BSCKc shown in FIG. 11. In operation S210, the c-th block select signal BLSLCc may be applied through the block word line connected to the c-th block select circuit BSCKc. By operation S210, the transistors included in the c-th block select circuit BSCKc connected to the c-th memory block BLKc, which is the selected block, are turned on. That is, the first block select circuit connected to the selected block is turned on. At time t3 of FIG. 12, the c-th block select signal BLSLCc increases from 0V to the V5 level. The fifth voltage of operation S210 may correspond to the V5 level of FIG. 12.

Then, a sixth voltage less than the fifth voltage is applied to the global word line and the global select line (S230). Activating the voltage of the global word line GWL and the global select lines GDSL and GSSL to the V6 level at time t3 of FIG. 12 may correspond to operation S230 of FIG. 13.

Thereafter, application of the erase voltage to the common source line is started (S250). Accordingly, the source bias applied to the common source line CSL increases. As described above, since the memory cells and the select transistors in the selected block, that is, the first memory block are turned on at time t3, the source bias may be transferred to the first to m-th bit lines BL1 to BLm. Accordingly, the first to m-th bit lines BL1 to BLm are precharged.

Thereafter, the voltage applied to the first block select circuit decreases to a seventh voltage, and the ground voltage is applied to the global word line (S270). Referring to FIG. 12, at time t4, the c-th block select signal BLSLCc decreases from the V5 level to the V7 level.

Thereafter, an eighth voltage is applied to the global select line (S290). Referring to FIG. 12, the voltage of the global select lines GDSL and GSSL increases to the V8 level at time t5. As the source bias increases to the erase voltage Verase, the gate induce current (gate induce drain leakage (GIDL)) may occur in the source select transistor and the drain select transistor of the c-th memory block BLKc, which is the selected block, and the hot hole may flow into the direction of the channel. Accordingly, while the potential of the channel increases, the voltage of the local word line of the first memory block (i.e., the selected block) is maintained at 0V, and thus the memory cells included in the selected block are erased.

Referring to FIG. 13, it is shown that operations S210, S230, and S250 are sequentially performed in a method of operating the semiconductor memory device according to an embodiment of the present disclosure. However, the present invention is not limited to that timing. In another embodiment, operations S210, S230, and S250 may be performed in a different order. In still another embodiment, some operations of S210, S230, and S250 may be simultaneously performed while others are performed in any suitable order consistent with the teachings herein.

In addition, it is shown that operations S270 and S290 are sequentially performed in the method of operating the semiconductor memory device according to an embodiment of the present disclosure. However, the present invention is not limited to that timing. In another embodiment, operations S270 and S290 may be performed in reverse order. In still another embodiment, some operations of S270 and S290 may be simultaneously performed while others are performed in any suitable order consistent with the teachings herein.

Referring to FIG. 14, a voltage application condition and a bit line precharge operation according thereto between time t3 and time t4 are shown. As described above, all memory cells included in the c-th memory block BLKc, which is the selected block, are turned on between time t3 and time t4. Accordingly, the source bias applied to the common source line CSL is quickly transferred to the first to m-th bit lines BL1 to BLm through the c-th memory block BLKc. Thus, the first to m-th bit lines BL1 to BLm are precharged.

Figure 15:
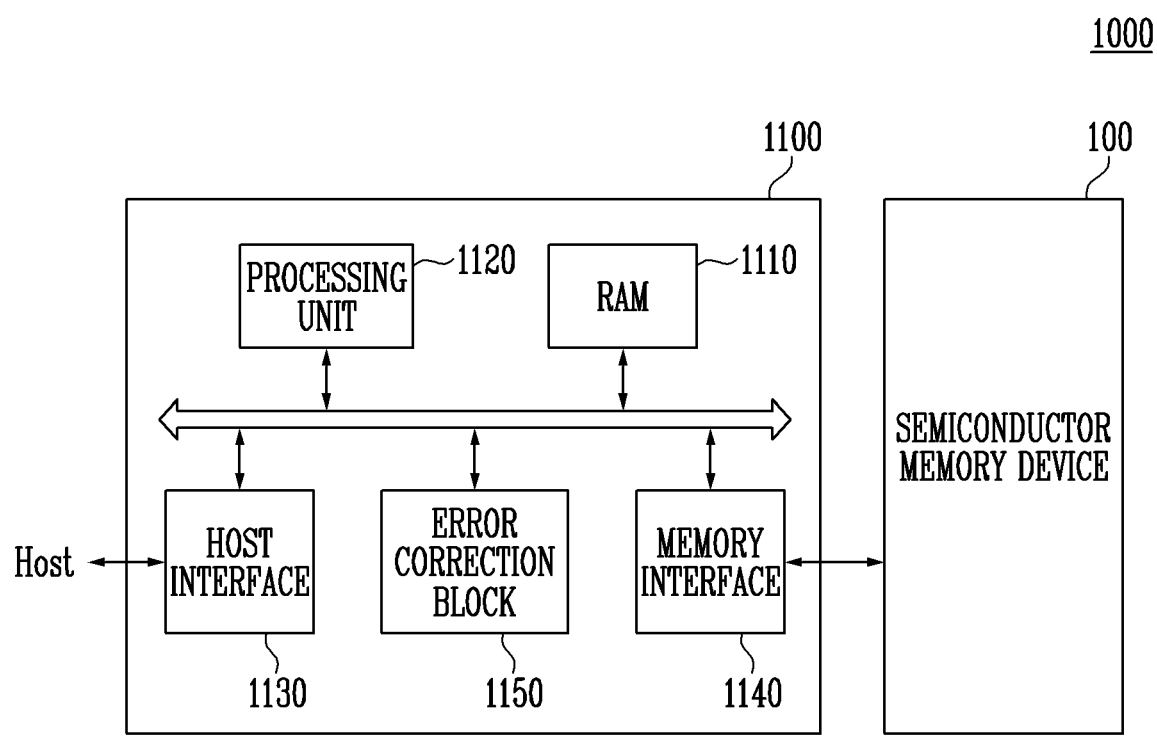
FIG. 15 is a block diagram illustrating an embodiment of a memory system including a semiconductor memory device, such as that of FIG. 1.

FIG. 15 is a block diagram illustrating an embodiment of a memory system 1000 including the semiconductor memory device of FIG. 1.

Referring to FIG. 15, the memory system 1000 includes the semiconductor memory device 100, which may be the semiconductor memory device described with reference to FIG. 1. The memory system 1000 may also include a controller 1100.

The controller 1100 is connected to the host (Host) and the semiconductor memory device 100. The controller 1100 is configured to access the semiconductor memory device 100 in response to the request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 may be used as an operation memory of the processing unit 1120, a cache memory between the semiconductor memory device 100 and the host, and/or a buffer memory between the semiconductor memory device 100 and the host. The processing unit 1120 controls overall operation of the controller 1100. In addition, the controller 1100 may temporarily store program data provided from the host during the write operation.

The host interface 1130 includes a protocol for performing data exchange between the host and the controller 1100. In an embodiment, the controller 1100 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and/or a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 using an error correcting code (ECC). The processing unit 1120 may control the read voltage according to an error detection result of the error correction block 1150 and control the semiconductor memory device 100 to perform re-reading. In an embodiment, the error correction block may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 16:
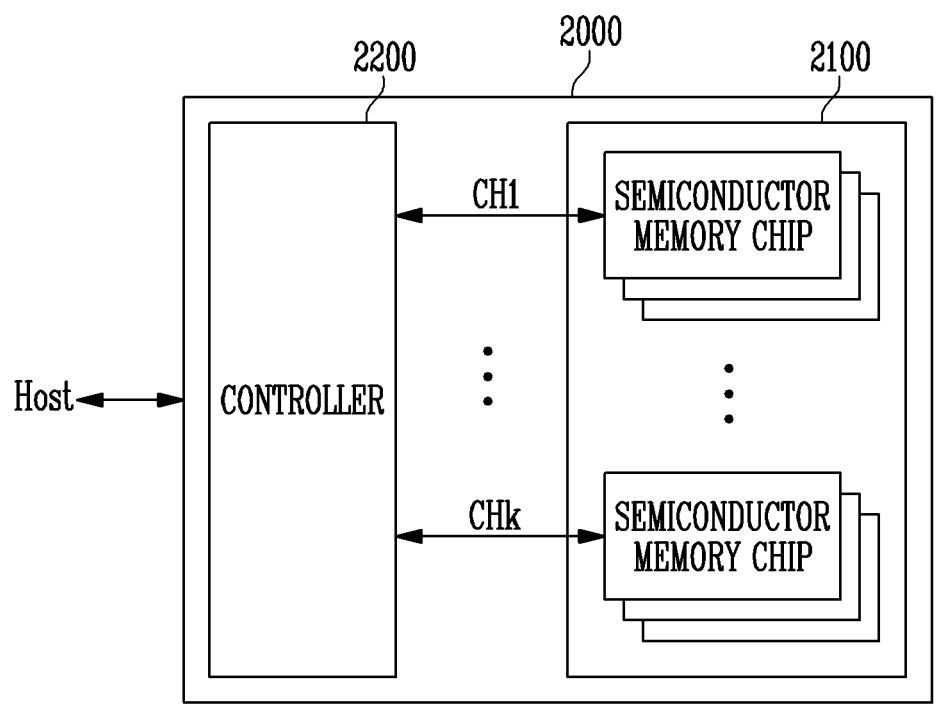
FIG. 16 is a block diagram illustrating an application example of a memory system, such as that of FIG. 15.

FIG. 16 is a block diagram illustrating an application example of the memory system of FIG. 15.

Referring to FIG. 16, the memory system 2000 includes a semiconductor memory device 2100 and a controller 2200. The semiconductor memory device 2100 includes a plurality of semiconductor memory chips. The plurality of semiconductor memory chips are divided into a plurality of, e.g., k, groups.

In FIG. 16, the k groups communicate with the controller 2200 through first to k-th channels CH1 to CHk, respectively. Each semiconductor memory chip is configured and operated similarly to the semiconductor memory device 100 described with reference to FIG. 1.

Each group is configured to communicate with the controller 2200 through its designated channel. The controller 2200 is configured similarly to the controller 1100 described with reference to FIG. 15 and is configured to control the plurality of memory chips of the semiconductor memory device 2100 through the plurality of channels CH1 to CHk.

Figure 17:
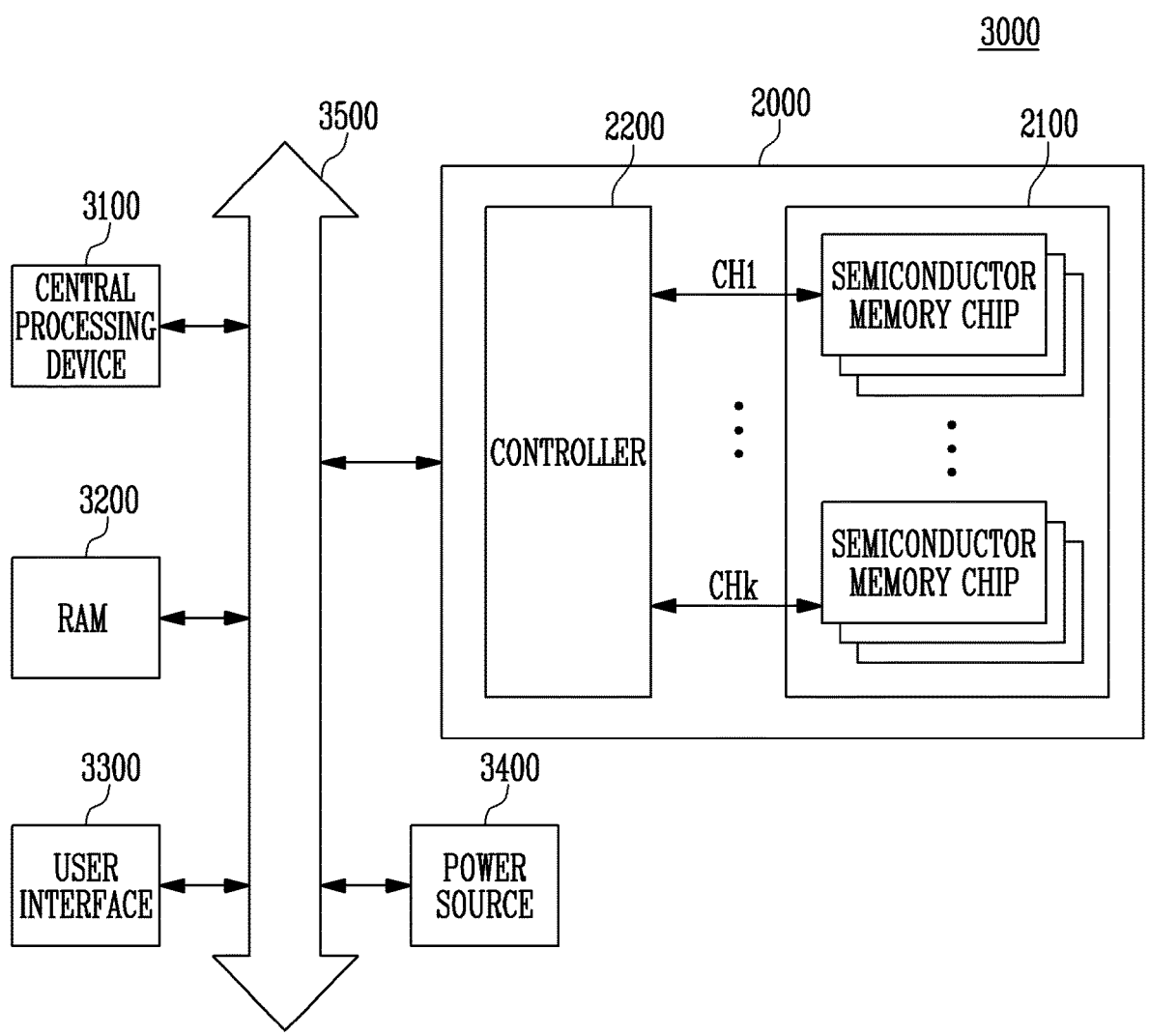
FIG. 17 is a block diagram illustrating a computing system including a memory system, such as that of FIG. 16.

FIG. 17 is a block diagram illustrating a computing system including the memory system described with reference to FIG. 16.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 17, the semiconductor memory device 2100 is connected to the system bus 3500 through the controller 2200. However, the semiconductor memory device 2100 may be configured to be directly connected to the system bus 3500. Function of the controller 2200 is performed by the central processing device 3100 and the RAM 3200.

In FIG. 17, the memory system 2000 described with reference to FIG. 16 is provided. However, the memory system 2000 may be replaced with the memory system 1000 described with reference to FIG. 15. In an embodiment, the computing system 3000 may be configured to include both the memory systems 1000 and 2000 of FIGS. 15 and 16.

The disclosed embodiments are merely specific examples describing the technical content of the present disclosure and facilitating understanding of the present invention, which is not limited by or to any such embodiment. It will be apparent to a person skilled in the art to which the present disclosure pertains that various modifications based on the technical spirit of the present disclosure may be made. The present invention encompasses all such modifications that fall within the scope of the claims.

What is claimed is:

1. A semiconductor memory device comprising:
a precharge block connected to a plurality of bit lines and including memory cells in an erase state;
a select block that shares the plurality of bit lines with the precharge block and includes memory cells in a program state;
a peripheral circuit configured to perform an erase operation on the select block; and
control logic configured to control the peripheral circuit to turn on a first block select circuit connected to the precharge block and apply a first voltage to global lines connected to the first block select circuit when an erase voltage is applied to a source line commonly connected to the precharge block and the select block,
wherein the memory cells of the precharge block are turned on by the first voltage applied from the global lines, and the erase voltage applied to the source line is transferred to the plurality of bit lines through the memory cells of the precharge block.

2. The semiconductor memory device of claim 1, wherein the first block select circuit is turned on, when the control logic controls the peripheral circuit to turn on a second block select circuit connected to the select block.

3. The semiconductor memory device of claim 1, wherein the global lines include at least one of a global word line and a global select line.

4. The semiconductor memory device of claim 3, wherein, after the erase voltage is transferred to the plurality of bit lines, the control logic controls the peripheral circuit to turn off the first block select circuit and apply a ground voltage to the global word line.

5. The semiconductor memory device of claim 4, wherein, after the first block select circuit is turned off and the ground voltage starts to be applied to the global word line, the control logic increases a voltage applied to the global select line from a first voltage to a second voltage.

6. A semiconductor memory device comprising:
a memory cell array including a plurality of memory blocks, wherein each of the plurality of memory blocks is connected between a plurality of bit lines and a source line;
a peripheral circuit configured to perform an erase operation on a select block, among the plurality of memory blocks, to apply an erase voltage to the source line connected to the select block; and
control logic configured to, during the erase operation, transfer the erase voltage of the source line to the plurality of bit lines through memory cells included in the select block by turning on the memory cells, and by turning off the memory cells.

7. The semiconductor memory device of claim 6, wherein the control logic is configured to control the peripheral circuit to:
turn on a first block select circuit connected to the select block, and
turn off a second block select circuit connected to at least one other block that is not an erase target among the plurality of memory blocks.

8. The semiconductor memory device of claim 6, wherein the control logic is configured to control the peripheral circuit to turn on a first block select circuit connected to the select block by applying a first voltage to the first block select circuit, and applying a second voltage to global lines connected to the first block select circuit when the erase voltage is applied to the source line connected to the select block, and
wherein the global lines include at least one of a global word line and a global select line.

9. The semiconductor memory device of claim 8, wherein, after the erase voltage is transferred to the plurality of bit lines, the control logic controls the peripheral circuit to decrease a voltage applied to the first block select circuit from the first voltage to a third voltage and to apply a ground voltage to the global word line.

10. The semiconductor memory device of claim 9, wherein, after the third voltage is applied to the first block select circuit and the ground voltage is started to be applied to the global word line, the control logic increases a voltage applied to the global select line from the first voltage to a fourth voltage.

11. A method of operating a semiconductor memory device including a plurality of memory blocks that are connected to a plurality of bit lines, the method comprising:
turning on a first block select circuit connected to a first memory block among the plurality of memory blocks;
turning on memory cells included in the first memory block by applying a first voltage to global lines connected to the first block select circuit;
transferring an erase voltage, which is applied to a common source line connected to the first memory block, to the plurality of bit lines through the memory cells, in response to the memory cells being turned on; and
turning off the memory cells and applying the erase voltage to a target memory block of an erase operation, which is connected to the common source line among the plurality of memory blocks, in response to the memory cells being turned off.

12. The method of claim 11, further comprising:
applying a ground voltage to a global word line among the global lines after transferring the erase voltage to the plurality of bit lines connected to the first memory block; and
increasing a voltage of a global select line among the global lines from the first voltage to a second voltage.

13. The method of claim 12,
wherein the first memory block is a precharge block in an erase state, and
the method further comprises turning off the first block select circuit after transferring the erase voltage to the plurality of bit lines connected to the first memory block.

14. The method of claim 13, further comprising: turning on a second block select circuit connected to a second memory block that is different from the first memory block and is the target memory block among the plurality of memory blocks.

15. The method of claim 12,
wherein the first memory block is a select block that is the target memory block, and
the method further comprises decreasing a voltage applied to the first block select circuit from the first voltage to a third voltage after transferring the erase voltage to the plurality of bit lines connected to the first memory block.

16. The method of claim 15, wherein the first voltage is greater than a largest threshold voltage among threshold voltages of memory cells in the select block.

17. A semiconductor memory device comprising:
a target block and an erased block respectively including first and second cell strings commonly coupled to a source line and a bit line;
first and second circuits configured to respectively couple the target and erased blocks to global lines when turned on; and
a control circuit configured to, during an erase operation on the target block:
turn on the second circuit by a second voltage and provide the global lines with a third voltage to turn on the second cell string, during a set period of time, while turning on the first circuit by a first voltage lower than the second voltage,
provide the source line with an erase voltage to precharge the bit line through the turned-on second cell string, and
provide a fourth voltage to a select line among the global lines after the set period of time.

18. A semiconductor memory device comprising:
a target block including a cell string coupled to a source line and a bit line;
a select circuit configured to couple the target block to global lines when turned on; and
a control circuit configured to, during an erase operation on the target block:
apply a first voltage to turn on the select circuit and apply a second voltage to the global lines to turn on the cell string, during a set period of time,
apply an erase voltage to the source line to precharge the bit line through the turned-on cell string,
apply a third voltage, which is lower than the first voltage, to turn on the select circuit after the set period of time, and
apply a fourth voltage to a select line among the global lines after the set period of time, wherein the second voltage is lower than the first voltage.

* * * * *